(12) United States Patent
Akhssay et al.

(10) Patent No.: US 12,147,161 B2
(45) Date of Patent: Nov. 19, 2024

(54) METHODS OF TUNING A MODEL FOR A LITHOGRAPHIC PROCESS AND ASSOCIATED APPARATUSES

(71) Applicant: ASML NETHERLANDS B.V., Veldhoven (NL)

(72) Inventors: Mhamed Akhssay, Helmond (NL); Pierluigi Frisco, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 116 days.

(21) Appl. No.: 17/795,058

(22) PCT Filed: Jan. 11, 2021

(86) PCT No.: PCT/EP2021/050361
§ 371 (c)(1),
(2) Date: Jul. 25, 2022

(87) PCT Pub. No.: WO2021/160351
PCT Pub. Date: Aug. 19, 2021

(65) Prior Publication Data
US 2023/0084130 A1    Mar. 16, 2023

(30) Foreign Application Priority Data

Feb. 12, 2020 (EP) .................................... 20156986
Jun. 3, 2020 (EP) .................................... 20178091

(51) Int. Cl.
*G03F 7/20* (2006.01)
*G03F 7/00* (2006.01)

(52) U.S. Cl.
CPC ...... *G03F 7/70258* (2013.01); *G03F 7/70283* (2013.01); *G03F 7/706* (2013.01)

(58) Field of Classification Search
CPC ... G03F 7/70258; G03F 7/70283; G03F 7/706
See application file for complete search history.

(56) References Cited

U.S. PATENT DOCUMENTS

| 7,307,690 | B1 | 12/2007 | De Winter et al. |
| 10,705,434 | B2 * | 7/2020 | Adel ................ G03F 7/70491 |

(Continued)

FOREIGN PATENT DOCUMENTS

| EP | 3290911 | 3/2018 |
| TW | 201303513 | 1/2013 |

(Continued)

OTHER PUBLICATIONS

International Search Report and Written Opinion issued in corresponding PCT Patent Application No. PCT/EP2021/050361, dated Apr. 9, 2021.

(Continued)

*Primary Examiner* — Mesfin T Asfaw
(74) *Attorney, Agent, or Firm* — Pillsbury Winthrop Shaw Pittman, LLP

(57) ABSTRACT

A method at tuning a lithographic process for a particular patterning device. The method includes: obtaining wavefront data relating to an objective lens of a lithographic apparatus, the wavefront data measured subsequent to an exposure of a pattern on a substrate using the particular patterning device; determining a pattern specific wavefront contribution from the wavefront data and a wavefront reference, the pattern specific wavefront contribution relating to the patterning device; and tuning the lithographic process for the particular patterning device using the pattern specific wavefront contribution.

21 Claims, 5 Drawing Sheets

(56) References Cited

U.S. PATENT DOCUMENTS

2013/0212543 A1 8/2013 Crouse et al.
2016/0342097 A1* 11/2016 Conradi .................. G03F 7/708
2019/0227441 A1 7/2019 Imponente et al.

FOREIGN PATENT DOCUMENTS

WO 2016146217 9/2016
WO 2019179782 9/2019

OTHER PUBLICATIONS

Taiwanese Office Action issued in corresponding Taiwanese Patent Application No. 110102222, dated Aug. 25, 2021.
Beak et al., "Lens heating impact analysis and controls for critical device layers by computational method," Proc. of SPIE, vol. 8683 (2013).

* cited by examiner (a)

(b)

METHODS OF TUNING A MODEL FOR A LITHOGRAPHIC PROCESS AND ASSOCIATED APPARATUSES

CROSS-REFERENCE TO RELATED APPLICATIONS

This application is the U.S. national phase entry of PCT/EP2021/050361 which was filed on Jan. 11, 2021, which claims the benefit of priority of European Patent Application No. 20156986.0 which was filed on Feb. 12, 2020 and of European Patent Application No. 20178091.3 which was filed on Jun. 3, 2020 which are incorporated herein in their entireties its entirety by reference.

FIELD OF THE INVENTION

The present invention relates to methods and apparatus usable, for example, in the manufacture of devices by lithographic techniques, and to methods of manufacturing devices using lithographic techniques.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

The lithographic apparatus comprises a projection system. The projection system comprises optical elements such as, for example, lenses. Optical aberrations may arise from imperfections in the optical elements. Optical aberrations may also arise from projection effects such as, for example, the heating of optical elements that occurs during a lithographic exposure. Projection system models are used to determine one or more adjustments that may be made to the optical elements of the projection system. The determined adjustments may have the effect of reducing optical aberrations within the projection system.

It may be desirable to provide, for example, to improve on aspects of calibration, tuning and/or use of a projection system modelling method which obviates or mitigates one or more of the problems of the prior art, whether identified herein or elsewhere.

SUMMARY OF THE INVENTION

The invention in a first aspect provides a method of tuning a lithographic process for a particular patterning device, the method comprising: obtaining wavefront data relating to an objective lens of a lithographic apparatus, measured subsequent to an exposure of a pattern on a substrate using said particular patterning device; determining a pattern specific wavefront contribution from the wavefront data and a wavefront reference, the pattern specific wavefront contribution relating to said particular patterning device; and tuning said lithographic process for said patterning device using said pattern specific wavefront contribution.

Also disclosed is lithographic apparatus comprising being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
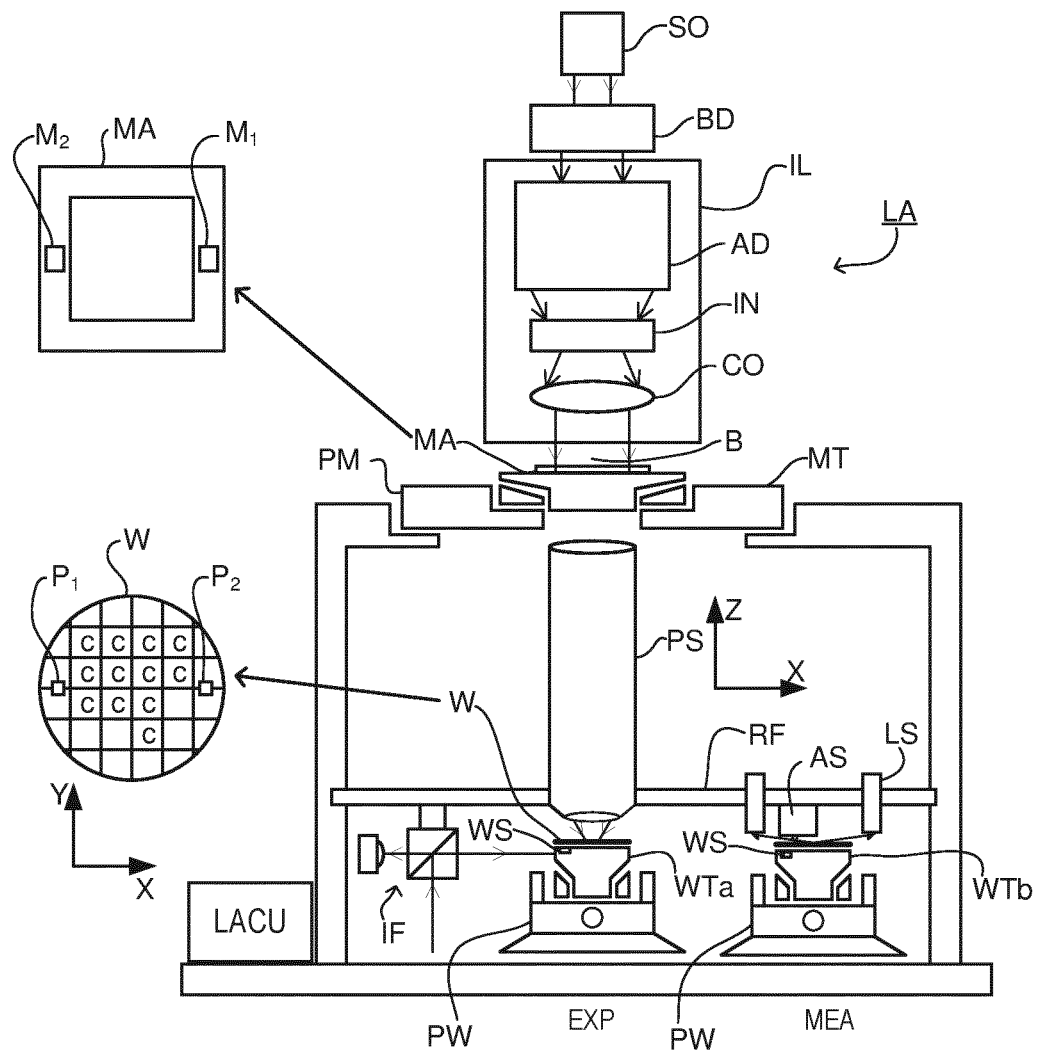
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

The lithographic apparatus LA further comprises a wavefront sensor WS; e.g., on each substrate table WTa, WTb. Such a sensor may measure the quality of the wavefront image, as well as any aberrations and therefore enable (e.g., parallel) measurement of optical aberrations throughout the projection slit, thus enabling, for example, a more accurate alignment, improved reticle heating correction and on the fly lens heating correction. The wavefront sensor may comprise an interferometric wavefront measurement system and may perform static measurements on lens aberrations up to high order. It may be implemented as an integrated measurement system used for system initialization and calibration. Alternatively, it may be used for monitoring and recalibration "on-demand". As such, the wavefront sensor may be able to measure the lens aberrations on a per lot or per-wafer basis depending on its design.

Figure 2:
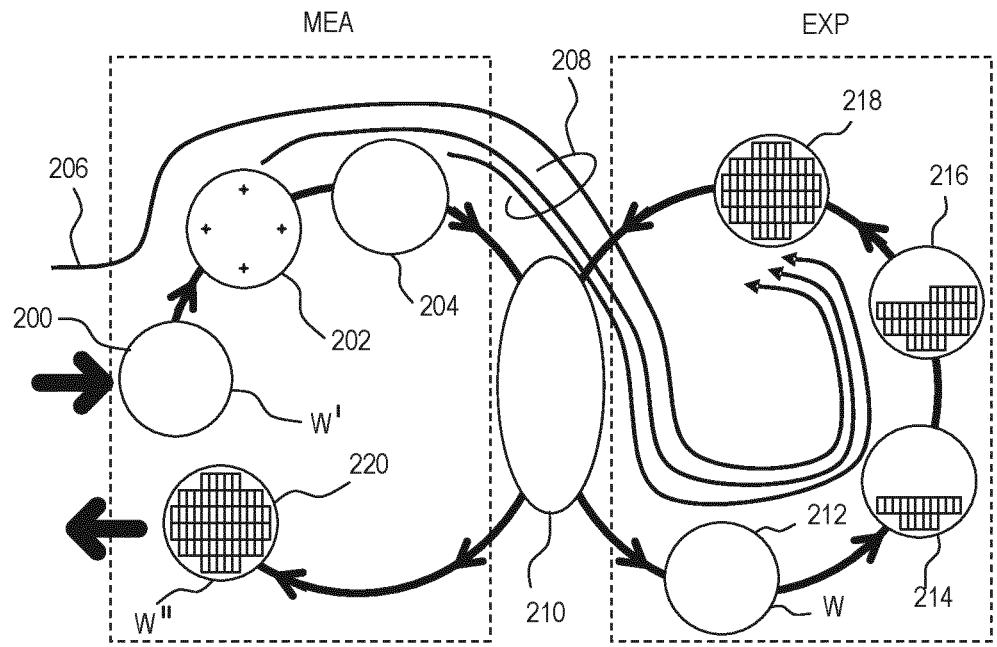
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W″ is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Concepts disclosed herein relate to use of a wavefront sensors such as the wavefront sensor WS described above. Such wavefront sensors can be used to measure wavefront errors or aberrations, which are typically described as coefficients in a series of 2D mathematical functions called Zernike polynomials. These can be regrouped to describe some well-known optical aberrations, such as spherical, coma, and astigmatism.

Normally a wavefront based on product structures cannot be measured directly using wavefront sensors. However, for a lens having been heated through exposure, the wavefront signal will carry a "memory" or "ghost" of an exposed product feature (a pattern or reticle, illumination and dose specific wavefront contribution). This is because, when a product feature is exposed, the lens (i.e., the optical column) heats up in the pupil plane, based on diffraction induced by the illumination mode combined with the product features on the reticle Immediately after the exposure ends, the wavefront data may be measured using the wavefront sensor; this sensor will observe a change in the wavefront with respect to lens when cold, resulting from and describing the shape of the product feature and illumination settings. This shape will gradually fade away, as the heat diffuses in the lens material. It is proposed to take advantage of this phenomenon and use this wavefront data (e.g., a difference wavefront comprising the difference of a hot lens wavefront measurement and a reference wavefront; e.g., a cold lens wavefront measurement) for a number of different applications. In an embodiment, the concepts described herein propose to use the raw wavefront sensor signal, that is the pixelated image captured by the wavefront sensor camera, e.g., without Zernike decomposition to determine the pattern specific wavefront contribution. Such raw wavefront data may be a mapped representation of wavefront error (scalar) across the exit pupil plane of objective lens, instead of having vectorized the wavefront to Zernike coefficients. Alternatively, the pattern specific wavefront contribution may be determined from the wavefront data processed into Zernike polynomials in the conventional way.

Among the factors affecting overlay and focus drift, lens heating is a major factor in deterioration of image quality, particularly with the very localized illumination sources often used, such as dipole illumination. These localized heat distributions on the lens can cause undesired effects on imaging wavefront. Aberration drift during lot exposure is unavoidable due to the heating of the lens during the exposure. The accumulated absorption of light in the lens can eventually cause the imaging imperfections which are the direct results of lens heating-induced wavefront errors.

Therefore in a first embodiment, it is proposed that this raw wavefront data is used in improving lens heating control, and in particular in improving calibration and/or qualification of a lens heating model for prediction of lens heating. In other variations of this first embodiment, the raw wavefront data is not used, and another reticle description used in its place.

Thus, lens heating (LH) control is important for maintaining imaging quality. An important step in LH control the ability to predict lens heating accurately. A present system, known as the Application Specific CALibration (ASCAL) method is used on some systems to predict lens heating effect by measuring wavefront drift (e.g., using the wavefront sensors WS described above). The aforementioned Zernike coefficients during lot exposure can be measured by ASCAL on different slit positions and at different wafer numbers to help understand and predict LH evolutionary behaviors. The predicted LH behavior then can be corrected by one or more of numerous LH correction options which are available on modern scanners, such as (for example) image tuner lens adjustment control. For example, ASCAL generates a lens heating feed forward (LHFF) dataset at the end of its calibration procedure for a device layer on a scanner. This LHFF dataset is applied to the target scanner and layer to correct the LH-induced wavefront drifts.

Figure 3:
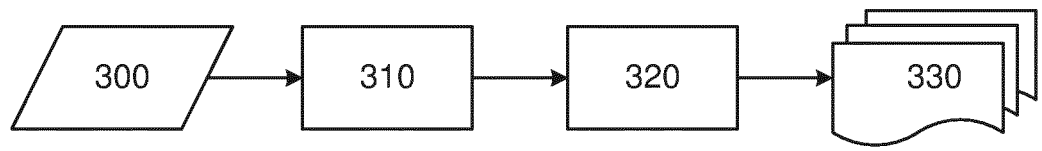
FIG. 3 illustrates (a) an empirical known method for determining a lens heating corrections; and (b) a computational known method for determining a lens heating corrections.
Figure 3:
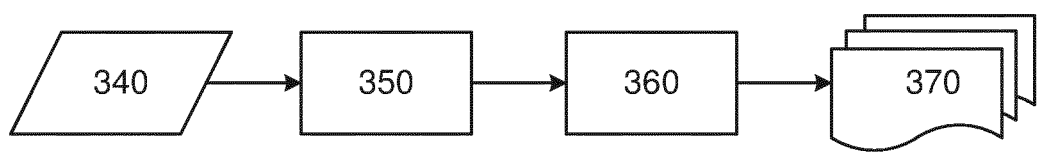

FIG. 3(*a*) illustrates the principal steps of an inline ASCAL flow. An exposure recipe 300, which may comprise reticle data, dose data and field dimension data for example, is used to determine scanner settings. These scanner settings are used in a step of performing a calibration test 310 on a scanner, and wavefronts measured using the wavefront sensor. Based on the resultant measurement data (e.g., wavefront or aberration measurement data which may be in the form of Zernike coefficients), model parameters 320 are fitted to the generic (e.g., physics based black box) model. Steps 300-320 are repeated for every application (e.g., every layer, recipe etc.) and the resultant fitted application specific model parameter values stored in database 330.

ASCAL is an effective method to reduce effects of lens heating. However, it requires dedicated tool time of, at least, 1-2 hours per layer, and for inline monitoring and correction (e.g., within the scanner), a test lot needs to be exposed and measured for each new reticle. This is a huge overhead in terms of time required on a scanner.

To address this time issue, an alternative strategy has been used, were the measurements are simulated. Such an approach is referred as computational ASCAL or cASCAL. cASCAL is described, for example, in "Lens heating impact analysis and controls for critical device layers by computational method"; Beak et al; Proceedings of SPIE—The International Society for Optical Engineering March 2014 which is incorporated herein by reference. In contrast to ASCAL which generates LHFF datasets based on measured data, cASCAL, generates LHFF datasets in a purely computational simulation. This results in a huge scanner time saving and therefore no scanner availability loss.

FIG. 3(*b*) illustrates the principal steps of the cASCAL flow. Application data 340, which may comprise reticle layout data, optical settings and illumination conditions (e.g., illumination pupil data) is used to computationally calculate a corresponding diffraction pattern 350. Based on this simulated diffraction pattern and a lens heating model for the lens used, the lens heating response is simulated. The simulated lens heating response is used to determine application specific model parameter values 360, which are stored in database 370. This is repeated for each application as before.

Figure 4:
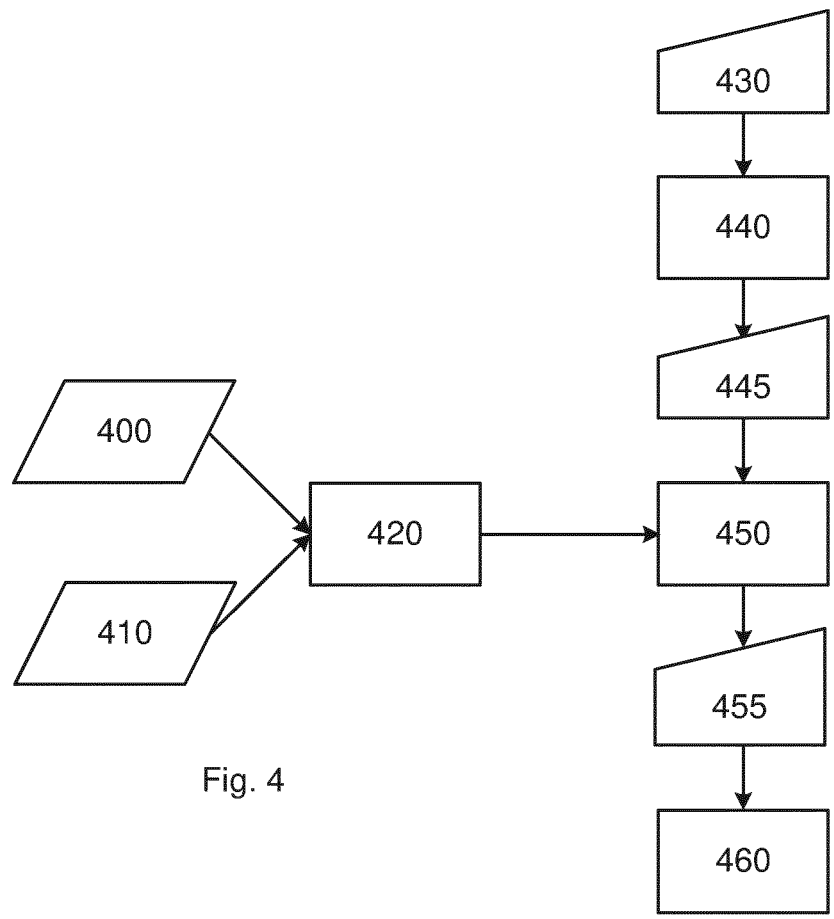
FIG. 4 is a flow chart of the method of FIG. 3(b) in increased detail.

FIG. 4 is a flowchart which describes the LH work flow for cASCAL. A reticle description 400 (which may be in the form of a Graphic Database System or GDS file) is combined with the illumination data 410 in order to obtain a diffraction pattern 420. A generic lens model 430 (e.g., for a specific lens family or lens type) undergoes a first tuning step 440 to have model parameters tuned for a specific lens to obtain a lens specific model 445. This step may be a one-off step performed by a scanner manufacturer prior to installation of a scanner. The diffraction pattern 420 is then used in a second tuning step 450 which comprises simulating and predicting lens heating on the lens specific model 445. The result of this second tuning step is an application specific model 455. All these steps are computational and do not require the exposure and readout of physical wafers. The method can be performed for reticles/layers to obtain a library of application specific models 455 for each layer. At a later stage, each application specific model 455 is used when exposing a respective to calculate/predict lens heating (LH) and corrections therefor during production 460.

A problem with the cASCAL framework described above is that it is not as accurate as the measured ASCAL framework. A further problem is that the reticle data (GDS file) is not always available for calculating the diffraction pattern.

It is therefore proposed to address one or both of these problems by defining a machine learning (e.g., data driven) model to predict lens heating during production (i.e., in real time). The model may be a neural network, such as a deep artificial neural network DANN (although any other suitable machine learned model may be used). This neural network model may augment the physics based lens specific model used presently in cASCAL, such that its predictions are refined by the neural network (e.g., by tuning the model parameters of the neural network).

In an embodiment, this neural network does not need a training set nor specific initial training for each new reticle/layer: instead it will improve and learn during production (real time training) while the scanner operates. This can be achieved by using real-time data from the wavefront sensor (which typically is used for reticle align before each wafer is exposed) and, for example, maintain it as close as possible to a target value (minimize deviation from the target).

Alternatively, the training of the neural network may be done in an initial training phase, for example, on actual production data (e.g., historic data from previous lots) To train a neural network means changing the weights present in the neural network. This means that, while training, the output of a neural network can change despite the input being the same. When scanners operate, it may be preferred to use models which are predictable in their performance. Therefore the neural network may be trained on production data, but it may be preferred that the 'output' of this neural network (tuning of the lens model) is not used in production during training, only when trained. The output of this network may therefore be used once training is completed and performance are satisfactory.

Figure 5:
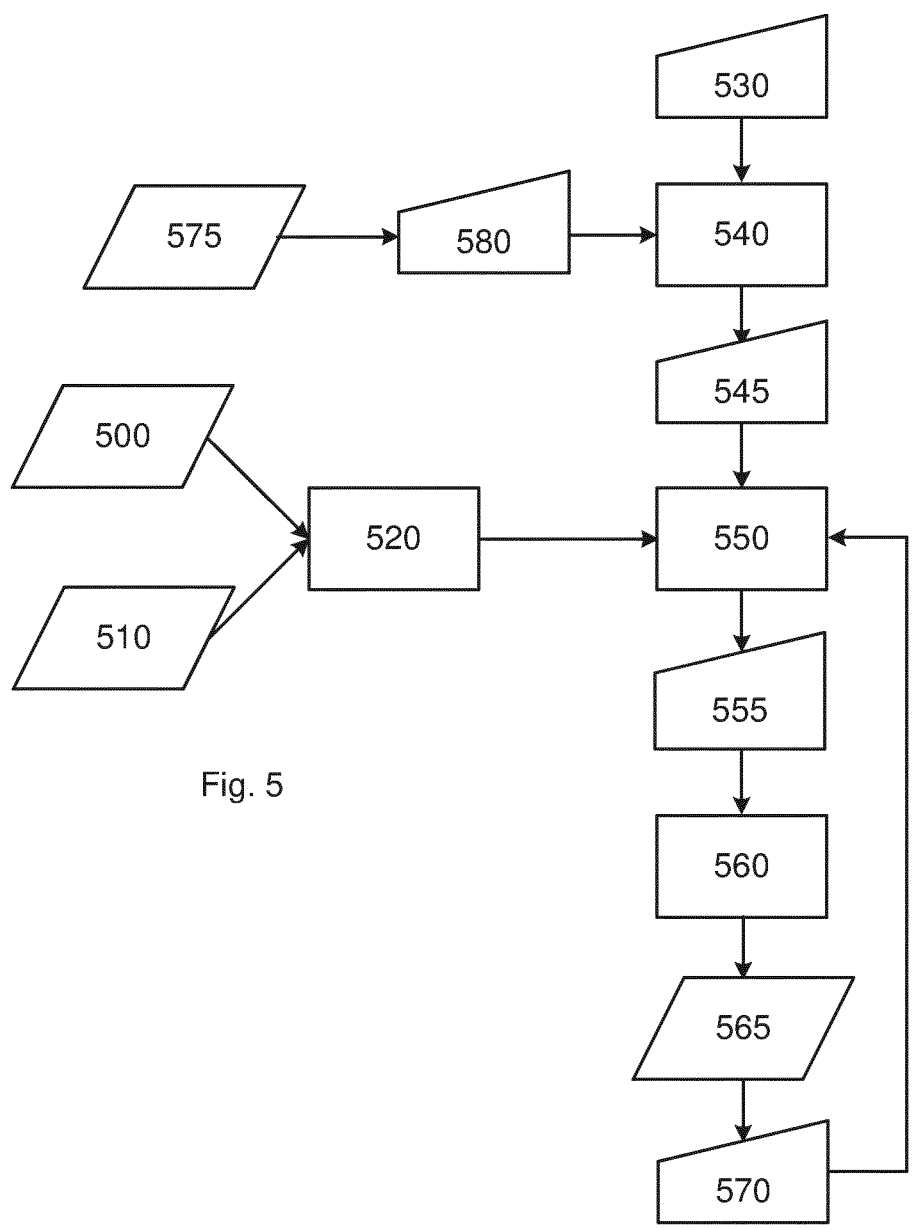
FIG. 5 is a flow chart of a method according to a first embodiment of the invention.

FIG. 5 is a flowchart of an improved method according to an embodiment. Steps/items 500-560 correspond with the respective steps/items 400-460 of the method of FIG. 4. The difference is that wavefront sensor data (e.g., aberration data) 565 is collected during the lot production 560 and used to a train a neural network (or second model) 570 to tune 550 the parameters of the main lens model (or lens heating model) or first model 545; e.g., to obtain application specific model 555 such that it improves the aberration performance as measured by the wavefront sensor. The neural network 570 therefore tunes the lens model 545 for a particular layer/reticle (defined by reticle data 500) and application during production using that reticle. In other words, this neural network 570 can be regarded as an additional feed forward control built on top of the current feed forward control, and which adapts to the layer currently in production.

Figure 6:
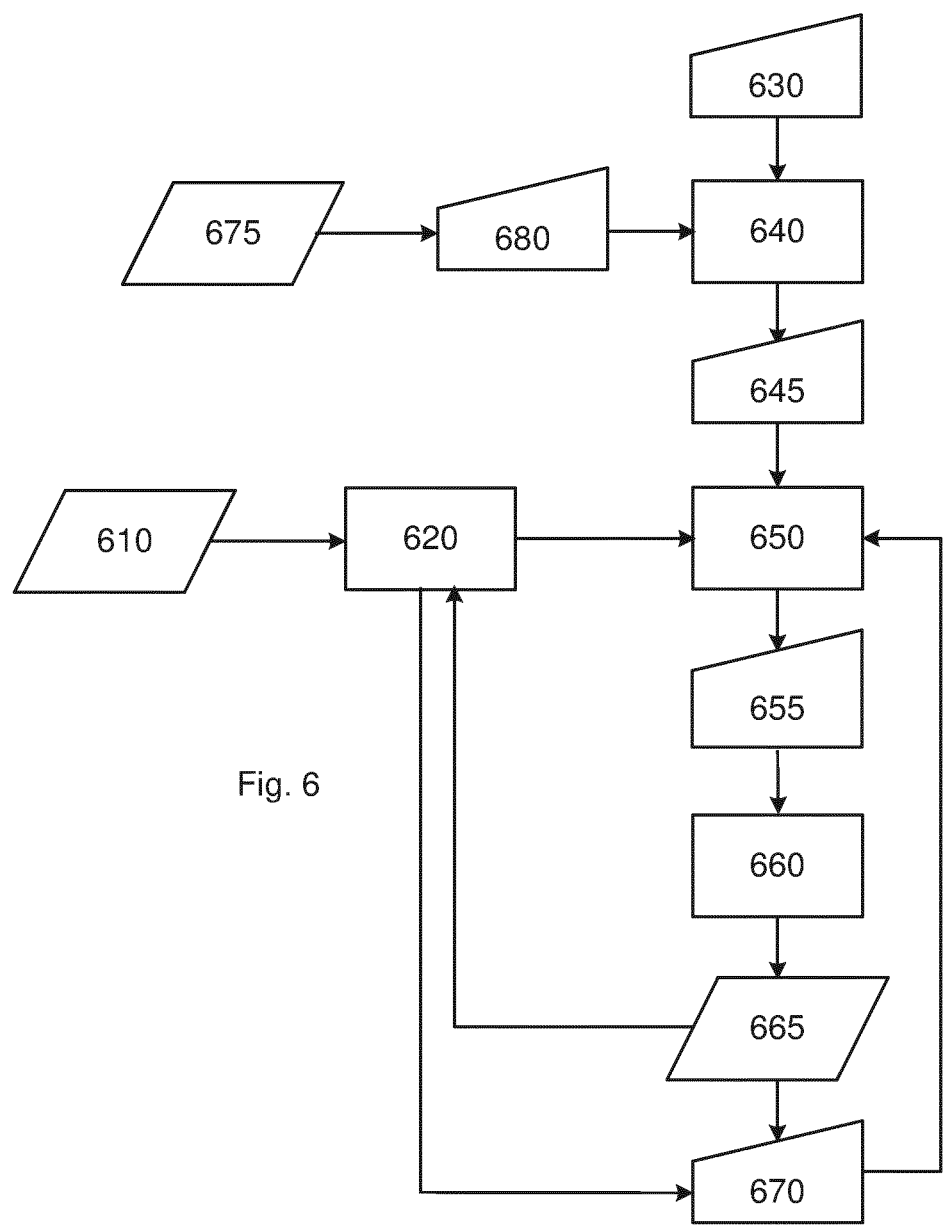
FIG. 6 is a flow chart of a method according to a second embodiment of the invention.

FIG. 6 is a flowchart of an improved method according to another embodiment where the output of the wavefront sensor 665, e.g., the raw pixelated sensor data (image data) rather than the Zernike decomposition data, is used with the illumination pupil 610 to compute the diffraction pattern (or related characteristic such as a transmission profile or lens heating profile) 620. As already mentioned, the reticle data 400, 500 is not always available. In this manner, the raw wavefront data 665 is used to address the reticle specific LH component and the first model 655 and/or second model 670 (alone or in combination) is/are not dependent on any reticle (design) data, nor any time consuming wafer exposure and readout. The wavefront data 665 for calculating the diffraction pattern may comprise a difference wavefront after and before an exposure step.

This allows a more intelligent and dynamically updated control of the lens model parameters. For example the neural network 670 can use the raw sensor wavefronts 665 to train the untuned lens model 645 for a particular layer, such that the tuned lens model 655 better predicts lens drift characteristics based on the wavefront information 665.

As already explained, the wavefront measurements performed during lot exposures comprise valuable information on the heating profile of the (near pupil plane) lens elements and are hence indicative of the reticle diffraction pattern. This is because specifics of the pattern layout on the reticle are reflected by its diffraction pattern in the exit pupil of the scanner's projection lens. Therefore the reticle feature layout (and transmission) determines to a large extent how the projection lens is heated (e.g., the spatial intensity distribution at its optical surfaces) and hence how its heating induced wavefront error evolves. The wavefront error evolution (pixelated wavefront) in time can be measured using the wavefront sensor(s) and, due to the above, is indicative of the reticle specific lens heating component. Hence in general, raw (e.g., pixelated) wavefront data can be used to determine/tune LHFF model parameters in the absence of reticle design data. Typically, the wavefront is measured during reticle alignment before exposure of each wafer.

Steps/elements 610 to 670 correspond to the respective steps/elements 510 to 570 of the flowchart of FIG. 5. However, note that there is no equivalent for the reticle data 500 as no reticle data (e.g., a GDS file or similar) is used in this embodiment. As such, the step of calculating a diffraction pattern 620 uses the raw wavefront data 665 (e.g., a difference wavefront) from the wavefront sensor and the illumination data 610 to calculate the LHFF model parameters 650. The calculated diffraction pattern 620 and/or the wavefront data 665, which may be obtained before exposing each wafer (e.g., raw image and/or processed aberration data), is used to train the second model 670 to tune the first model 645 for the particular application (layer or reticle) to obtain application specific model 655.

As mentioned, this flow of FIG. 5 or 6 may be changed such that the training of the neural network is done on historic data and no further training of this network is done during actual production; instead the (fixed) trained neural network is used in production to tune the lens model on production data.

All the above methods (e.g., as described in FIGS. 5 and 6) may comprise an initial training step to train a third model

580, 680 (e.g., a machine learning, neural network or DANN) which trains the initial generic lens model 530, 630 (e.g., modelling a type of lens, where such a lens model may be supplied by a lens supplier) for a specific lens (e.g., as part of a scanner set-up stage which may be performed before the scanner is installed). As such, the third model 580, 680 may perform step 540, 640 of the flow diagrams described above. Given a specific lens type, the generic lens model 530, 630 is augmented using test data 575, 675 e.g., from a lens heating test for that specific lens during setup. The neural network 580, 680 which is trained on this test data 575,675 may be specifically created for each lens type; e.g., using the input of several (e.g., similar) reticles. Once again this third model 580, 680 may augment the first 530, 630 (and second 570, 670) model. The physics based lens model 530, 630 may be augmented with a neural network 580, 680 specific for each lens type and by another a neural network 570, 670 operating in real time which adapts to the layer currently being printed.

While the above embodiment discloses the concepts in terms of lens heating correction, these concepts are not so limited and should not be construed as such. The same concepts may be applied to predict and correct for reticle heating and wafer heating, for example. In such a case the first model is a reticle heating model or a wafer heating model as appropriate. In such embodiments the output of the workflow (feedforward corrections from the first model as augmented by at least the second model) can be used to actuate wafer and/or reticle stages, respectively. This may therefore improve LH prediction at many levels: e.g., wafer to wafer, field to field and/or intrafield.

In another embodiment, the raw wavefront data may be used in a lens setup step which takes the lens model from its initial calibrated state (having typically been performed on a cold lens) to a starting point optimized for a specific reticle/layer.

The goal of a lens model is to optimize the lens's aberrations within the lithographic system. In some cases, the optimization target may be zero aberrations, or else it may be another fingerprint, e.g., often expressed in Zernike coefficients. The lens quality and lens setup optimization determines, for a given system, how well the optimization target is achieved. The optimization target may defined by a merit function composed by sets of terms, having a dominant Least Squares term, often expressed as a weighted sum of Zernike coefficients, using values for weights associated with coefficients for odd and/or even (lower and/or higher order) Zernike polynomials; e.g., equal to (1, 1.2, 0.5). This may apply for both lens set-up (e.g., using a calibration lens model) and during production (e.g., using a driver lens model). Such a choice may be based on simplicity and qualitative considerations. Lens calibration and production performances may be optimized to the same target for all machines. While Zernike coefficients are independent polynomials, the current state of the art shifts may explicitly force the optimization to minimize some Zernike coefficients at the expense of some others. This is because of the lens, and that lens elements may affect more than one Zernike coefficient in different ways.

US2019227441A1, incorporated herein by reference, describes such a method. This may comprise receiving an initial merit function comprising an initial set of model parameters and weights, and executing an optimization algorithm starting from the initial set of model parameters and weights to determine a second merit function comprising a second set of model parameters and weights. The optimization algorithm scores different sets of model parameters and weights based upon projection system characteristics of a projection system adjusted according to the output of the lens model using a merit function having that set of model parameters and weights. The projection system may be adjusted using the optical element adjustments output by the lens model when executed using the second merit function. The optimization algorithm may generate other merit functions between the first merit function and the second merit function. The method may be used to thoroughly search across a complex solution space of the lens model in order to find suitable model parameters and weights that improve the performance of the lens model. The set of model parameters may correspond to at least some of the lens model characteristics. The set of model parameters may correspond to lens model constraints, e.g. a cut-off value of iterations involved in an algorithm or mathematical technique used in the lens model such as, for example, single value decomposition.

The optimization described above is determined using a finite number of Zernike polynomials, normally 64, which do not allow a full representation of the lens fingerprints. Therefore, it is proposed herein to setup and tune the lens using the raw wavefront sensor data. This enables the capture of all the lens fingerprint content and correct for it accordingly. Such a method may be implemented in software (e.g., running on the scanner or offline processing apparatus) which may be periodically fed with raw wavefront sensor data and continuously evaluates the wavefront.

The method may comprise a first tuning phase to determine a layer specific correction for the calibrated lens. Based on the heating profile, product reticle characteristics (e.g., the diffraction pattern resultant therefrom) can be inferred using the methods already disclosed herein. The heating profile may describe wavefront evolution as lens heating evolves; e.g., a wavefront difference between a cold and hot lens or relative colder and hotter lens measured when exposing the reticle). This diffraction pattern can be used to determine a product-specific initial lens correction (e.g., a correction subrecipe) for the lens model; e.g., the diffraction pattern or determined reticle characteristics may be subsequently combined with the measured wavefront, and an optimization performed to determine this product-specific initial lens correction. The product-specific initial lens correction can be applied to the calibrated lens model. As such, application of this product-specific initial lens correction will bring the lens from an initial calibrated state, to an initial (starting) state optimized for printing a given layer (e.g., for the specific reticle). This can then be used to optimize the subrecipe toward a target wavefront (e.g., zero aberrations or otherwise) using that reticle.

Such an embodiment may use a merit function to define the optimization target which is image based instead of being polynomial based. The optimization algorithm may be an evolutionary algorithm or genetic algorithm, having a fitness function, the fitness function being configured to perform the scoring of different sets of model parameters and weights. In other embodiments an ANN or DANN may be used to determine the subrecipe. The optimization may determine a lens correction which corrects the measured wavefront to a target wavefront. The optimization and merit function may be similar to that described above (e.g., as described in US2019227441A1), other than being performed on the raw wavefront (image) data and not on a Zernike decomposition.

This first phase may be performed offline (e.g., using historic data) to determine a static product-specific initial lens correction or subrecipe for the reticle. This can be repeated for all reticles of a product, such that a library of subrecipes can be created, each corresponding to a different reticle. In this way, during production, the corresponding subrecipe for each reticle can be applied to the lens model prior to exposure using the reticle.

In a variation, instead of determining the reticle characteristics from the wavefront data, a reticle file or (at a more basic level) the reticle transmission factor (e.g., the percentage of light transmitted by the reticle) and the proposed illumination setting is combined with the measured wavefront data and the image based optimization performed to determine the product-specific initial lens correction.

A second phase, during exposure of the same layer in production, may comprise monitoring the wavefront data to check whether the lens is drifting from the optimized state reached using the subrecipe. If drifting, an in-situ calibration may correct the lens settings (e.g., via a lens manipulator). This may comprise a further (image-based) optimization which optimizes the wavefront, based on the reticle diffraction pattern determined from the raw wavefront data and the lens characteristics (i.e., actuator constraints).

In such a manner complex optimization techniques may be used to achieve fast convergence of lens manipulator settings to a target wavefront.

The concepts above may be extended, so as to additionally use per field alignment and/or level sensor data in the optimization in order to determine optimal lens settings per field. Such a method may comprise performing a lens optimization per field based on the raw wavefront data and the per field data in order to achieve real time best focus and overlay (e.g., real time corrections for focus and overlay.

A similar procedure can be applied to setup lenses, the only difference with the above is the setpoint: instead of using a product reticle (as above) to determine the product-specific initial lens correction, the above process is performed using a test reticle.

This embodiment may be performed in combination with the embodiment of FIG. 5 or 6; e.g., to provide an improved starting point for the production step 560, 660, and optionally a monitoring step. Alternatively this embodiment may be implemented individually.

An output of the tuned lens model may comprise residual optical aberrations present in the projection system, in which case, model parameters and weights which lead to lower residual optical aberrations may be given better scores by the optimization algorithm. The projection system characteristics need not be optical aberrations and may instead, or additionally, be overlay errors, root mean square wavefront errors, focus errors, optical element adjustment constraints and other characteristics which will be apparent to the skilled person from the teaching herein. A focus example will now be described.

In a further embodiment, a similar methodology to the lens setup optimization immediately above will be described for improving focus calibration and measurement for the lens model.

Presently, focus calibration (e.g., to calibrate Zernike coefficient 4 and 5 associated with the main (feature independent) defocus Zernike) is determined using a focus test. A special reticle may be used to expose a plurality of verification fields at different focus offsets on a test substrate, each of which comprising a plurality of focus marks (e.g., in the region of 250 marks). These focus marks on the reticle produce corresponding marks on the substrate which can be read (e.g., using an alignment sensor) so as to infer the focus setting during that exposure. Because this test comprises the exposure of wafers, it is time consuming. The remaining focus (even) Zernike coefficients are calibrated using the wavefront sensor: its signal is typically decomposed into the first 64 Zernikes as has already been described. During production, reticle align and focus drift are measured and corrected for using a Zernike decomposition of the wavefront sensor data. As already described, such a polynomial representation, because it is truncated to 64 or 100 Zernike coefficeints, does not allow a full representation of a lens's fingerprints.

As such, it is proposed to complement or replace the current method for focus measurement as described above (e.g., in setup and/or during production) with a method based on a series of raw wavefront measurements performed at different focus levels. These measurements enable estimation of focus in a more precise and efficient way.

In a setup stage, it is proposed that the measured wavefront of a warmed up or hot lens (or a difference wavefront as described) is used to determine the best focus for a particular reticle or product feature to be imaged. The method comprises repeatedly exposing a product feature to warm up the lens, and subsequently measuring the (raw) wavefront, each repetition being performed at a different focus level (e.g., covering a focus range comprising the expected best focus value). Each measurement will result in a different wavefront which can be used to determine best focus through an optimization; e.g., best focus for a preferred or particular wavelength.

The optimization may be similar to that described in the previous embodiment (e.g., an ANN or evolutionary algorithm) which optimizes (or uses as an input) the raw wavelength data rather than a Zernike representation. The main difference is that the previous embodiment's optimization was described in terms of optimizing for wavefront aberration (and therefore lens manipulator correction) and this optimization specifically optimizes for focus, and therefore the optimal relative stage position in the z-direction (i.e., perpendicular to the substrate plane) between reticle and substrate stages. This optimization may be performed on its own or in addition to the previous optimization for a lens subrecipe (and optionally in combination with the methods of FIGS. 5 and 6). Alternatively, a co-optimization for lens settings (product-specific initial lens correction) and best focus may be performed provided that the wavefront data used in the optimization relates to different focus levels.

In addition to performing a test during setup to remove the need for performing the present focus test, the aforementioned approach can be used in production to determine best focus in real time and monitor best focus drift, so as to improve reticle alignment. The method may comprise repeatedly performing the same optimization including the new wavefront data relating to each new wafer to determine whether best focus has drifted since setup and determine a new focus correction if so. By way of specific example, in order to check if best focus is drifting, three (or more) wavefront sensor measurements or captures may be performed after each wafer is exposed (i.e., with hot lens): one at current best focus, one at current best focus with a small shift in a first direction, and one at current best focus with a small shift in a second direction. These measurements can be compared to determine if best focus has drifted; if so, best focus can be adjusted accordingly.

In a further embodiment, a lens matching method using raw wavefront data is proposed. As has already been stated, the goal of lens setup is to optimize the lens aberrations within the lithographic system: e.g., to a target which may be zero. The lens quality and lens setup optimization determines, for a given system, how well the target is achieved.

Every lens has a different lens fingerprint (LFP), thus the performance has a population distribution. The spread of the population relates directly to Matched-Machine Overlay (MMO). For later lens models, there was a change in the mean LFP of the population. In order to keep the mean LFP unchanged with respect to earlier machines, a non-zero target equal to the previous population mean was introduced. Thus current state-of-the-art is to use a single target lens fingerprint for all lenses of a given type.

The target chosen may be based on a best average performance of a selection of lenses measured at a lens manufacturer. This target may differ from the mean population measured at the lithography manufacturer and also from the population at a particular fab. All machines for all users and fabs are setup to the same target, thus statistics and population analysis does not distinguish populations per user.

A user has only a limited set of machines whose population mean is typically different from that of the complete world-wide lens population. It makes sense therefore to target a given user's own population mean rather than the global population mean. The current approach, targeting the global population mean, reduces the potential for machine-to-machine intra-field fingerprint matching.

Moreover, and most importantly, the current scanner matching tests use test reticles. The matching performance of two scanners can be quite different if measured with a test reticle then when using product reticles. In general, the present machine matching performance is not ideal with respect to a production environment for the following reasons:
  The match is performed on cold lens;
  If the match is performed on hot lens, then the used reticle is not a production reticle;
  The match (cold or hot) is performed on one layer at a time and does not consider lens behavior on different layers (i.e., reticles).

It is therefore proposed to use raw wavefront data to predict how well scanners match for a particular product layer (reticle). This may be achieved by exposing the same product reticle on different machines (e.g., one tuning lot/25 tuning wafers per machine), recording the wavefront before each wafer is exposed and correcting the dynamic lens behavior of these machines with this reticle such that matching is optimized (e.g., in a way that maximizes yield when this reticle is exposed on these two or more machines).

It should be appreciated that this is different to the single lens heating calibration performed with raw wavefront data described in the first embodiment described by FIGS. 5 and 6. That embodiment aims to minimize the (e.g., overlay) effect of lens heating on one scanner at the time. This embodiment aims to match the dynamic behavior of two (or more) different scanners on the same reticle; this is not achieved by separately calibrating the lens heating behavior of the first scanner, and then the second scanner to match as close as possible to the dynamic behavior of the first scanner. Instead, the method comprises a co-optimization to match the dynamic behavior of the different scanner so as to be as close as possible (e.g., to maximize yield or other performance parameter).

Such a method may comprises using matching model or algorithm, such as an evolutionary or genetic algorithm, which operates to tune the lens models and/or models tuning the lens models based on wavefront data obtained during exposure using the particular (e.g., production) reticle.

As such, the matching model may operate directly on the lens models during a setup or matching operation, tuning the lens models in a similar manner to the "second model" disclosed above, but in a co-optimized method. Such a co-optimized method may provide co-optimized tuning (e.g., of model weights/coefficients) for each lens model which optimizes a performance indicator such as yield for product produced on both (or all) of the scanners being matched. It can be appreciated that while neither lens model is "aware" of the other, the matching model or algorithm is aware of both to provide the co-optimized tuning.

Alternatively, the matching model or algorithm may operate on top of the respective second models for each lens. Each of these second models (e.g., ANNs) is dedicated to its respective lens model and (as has already been described) tunes this lens model for the specific reticle used. As such, each second model is unaware of the other second model(s). The matching model may operate on top of these second models to tune them in a co-optimized fashion to provide co-optimized tuning (e.g., of model weights/coefficients) for each second model. For example, the matching model may receive the trained second models as an input and attempt to find the weights for a new or tuned second model(s) (neural network(s)). The aim of this new neural networks are to match the scanners while they produce. Ideally, new neural networks are able to match the performance of the matched scanners in a way that a layer can be exposed on any of these scanners without performance difference. In such an embodiment, the same data may be used to train the new neural networks as was used to train the earlier (unmatched) neural networks.

To provide a specific example, assume e.g., 5 different lenses of the same type. In theory, given the same reticle, dose and illumination profile then these 5 lenses should behave in the very same way (the only differences are in the physical differences of the 5 lenses). The setup of lenses of the same type is performed with the same dose, reticle and illumination profile. This means that, using this data, it is possible to train a neural network which is able to predict the behavior of such lens types for this dose, reticle and illumination profile. Now imagine that these 5 lenses are installed in a fab. Using production data (separated into different transmission factors, doses and illumination profiles), it is possible to augment (i.e., further tune) the neural network able to predict the behavior of such lens in order to obtain different neural networks, each of them trained to specific combinations of transmission factor, dose and illumination profile. If, using the same 5 machines, it is desired to expose a layer which has some difference in transmission factor, dose or illumination profile (e.g., for a reticle with a new transmission factor but exposed with same dose and illumination profile), then the matching model can use the neural network created for the these lenses for the transmission factor, dose and illumination profile used previously and create another neural network which behaves well to the new transmission factor, dose and illumination profile without having the need to train this new neural network on data. In other words, if there is a library of neural network for transmission factor, dose and illumination profile, then it is possible to create a new neural network (for a new transmission factor, dose or illumination profile) without any training data.

This matching model may be used only in the initial matching step, so as to tune the lens models or second models based on the initial tuning wafers exposed using the product reticle. During this matching step, the matching model may receive the respective model weights of the models it is tuning and wavefront data to evaluate matching.

Based on this, the optimization can tune the model weights to improve matching performance for that specific reticle.

Once the machines are matched, the matching model/algorithm is no longer required and the tuned lens models or second models are used during production.

Where the second models are tuned by the matching model, these second models will have been trained or optimized to tune its respective lens model (in real time) such that yield is maximized (or other parameter of interest optimized) for the reticle exposed on both (or all) of the two scanners, based on the wavefront data measured during production.

A similar technique can be employed to match two (or more) different layers exposed on the same scanner in order to improve overlay. A test lot of a few layers could be exposed, while recording the wavefront before each wafer is exposed for each layer. The optimization can then optimize model weights for improved dynamic lens behavior on the different layers in order to improve e.g., overlay or other parameter of interest Note that, in all the embodiments described above in which raw wavefront data is used, Zernike decomposed data may be used instead within the scope of the disclosure. The advantage of the raw data is that it contains all Zernike coefficients while decomposed data contains only Zernike coefficients up to a finite number (typically 64 or 100). As such, all the optimizations described above (lens setup, determine best focus, machine matching, . . . ) can use either raw data or Zernike decomposed data. It may be expected that using raw data will yield a better optimization. This is because (roughly speaking), with raw data the decision as to which Zernike coefficient(s) to consider is done during the optimization (a posteriori). If only the Zernike decomposition data is used, then the decision which Zernike coefficient(s) to consider is done at the beginning (a priori).

Further embodiments are disclosed in the subsequent list of numbered clauses:

1. A method of determining a correction for a lithographic process performed on a lithographic apparatus, the method comprising:
   obtaining a first heating model which models the effect of heating on a component during the lithographic process;
   obtaining measured wavefront data relating to an objective lens of the lithographic apparatus, measured during said lithographic process; and
   determining a correction for the lithographic process using the first heating model and measured wavefront data, to correct for said heating.
2. A method according to clause 1, comprising:
   calculating a characteristic of the patterning device used in the lithographic process;
   wherein the first model uses the calculated diffraction pattern to determine said correction.
3. A method according to clause 2, wherein said characteristic of the patterning device comprises one or more of: a diffraction pattern, a transmission profile of the objective lens and a lens heating profile.
4. A method according to clause 2 or 3, wherein the step of calculating a characteristic of the patterning device uses patterning device data as obtained from a description of the patterning device.
5. A method according to clause 2 or 3, wherein the step of calculating a characteristic of the patterning device uses said measured wavefront data to calculate the diffraction pattern, the measured wavefront data being dependent at least in part on the patterning device layout.
6. A method according to clause 5, wherein the measured wavefront data used for calculating the characteristic of the patterning device comprises raw wavefront sensor data comprising a pixelated image.
7. A method according to any preceding clause, wherein said measured wavefront data relates to a difference wavefront after and before an exposure step.
8. A method according to any preceding clause, wherein said step of determining a correction comprises:
   obtaining a second model;
   using the measured wavefront data and/or characteristic of the patterning device to train said second model to tune said first model for the lithographic process.
9. A method according to clause 8, wherein the second model tunes the first model for the lithographic process being performed.
10. A method according to clause 8 or 9, wherein the second model is a machine learning model.
11. A method according to clause 10, wherein the second model is a neural network.
12. A method according to any preceding clause, wherein said first model is a physics based model.
13. A method according to any preceding clause, wherein the first model is generic for a plurality of different lithographic processes.
14. A method according to clause 13, wherein the plurality of different lithographic processes relate to a plurality of different patterning devices.
15. A method according to any preceding clause, wherein the first model is a lens heating model.
16. A method according to clause 15, wherein the first model is further augmented by a third model having been trained to tune the first model for the specific projection lens used.
17. A method according to clause 16, wherein the third model is a machine learning model.
18. A method according to clause 17, wherein the third model is a neural network.
19. A method according to clause 16, 17 or 18, comprising an initial step of training the third model for the specific projection lens based on training data from a lens heating test.
20. A method according to any of clauses 1 to 14, wherein the first model is one of a patterning device heating model or substrate heating model.
21. A method according to any preceding clause, wherein said correction comprises a feed forward correction.
22. A method according to any preceding clause, comprising using said correction to correct the lithographic process.
23. An apparatus operable to perform the method of any preceding clause, comprising:
a wavefront sensor operable to measure said wavefront data and a processor apparatus operable to perform the other steps of the method.
24. A lithographic apparatus comprising the apparatus of clause 23.
25. A lithographic apparatus according to clause 24, comprising:
an illumination system for providing the measurement illumination;
said projection optics;

a patterning device support for supporting a patterning device; and a substrate support for supporting a substrate.

26. A method of tuning a lithographic process for a particular patterning device, the method comprising: obtaining wavefront data relating to an objective lens of a lithographic apparatus, measured subsequent to an exposure of a pattern on a substrate using said particular patterning device; determining a pattern specific wavefront contribution from the wavefront data and a wavefront reference, the pattern specific wavefront contribution relating to said particular patterning device; and tuning said lithographic process for said particular patterning device using said pattern specific wavefront contribution.

27. A method according to clause 26, wherein the tuning is based on raw wavefront data comprising a scalar representation as a map of wavefront error across an exit pupil plane of the objective lens.

28. A method according to clause 26 or 27, wherein at least some of said wavefront data is related to a target wavefront.

29. A method according to clause 28, wherein the target wavefront is a difference target wavefront relating to the difference between a wavefront before and after exposure of a substrate.

30. A method according to any of clauses 26 to 29, wherein the pattern specific wavefront contribution comprises a difference of a measured wavefront of said wavefront data subsequent to the exposure and said wavefront reference.

31. A method according to clause 30, wherein said wavefront reference comprises a measured wavefront, having been measured prior to said exposure.

32. A method according to any of clauses 26 to 31, wherein said tuning step comprises tuning a first model relating to a component of the lithographic apparatus using said wavefront data such that said first model is tuned for said particular patterning device.

33. A method according to clause 32, wherein the using said wavefront data comprises using said wavefront data in training a second model and using the trained second model to tune the first model.

34. A method according to clause 33, comprising:

using said pattern specific wavefront contribution to calculate a characteristic of the particular patterning device used in the lithographic process; and using the characteristic of the particular patterning device in said step of tuning the first model with said second model.

35. A method according to clause 34, wherein said characteristic of the particular patterning device comprises one or more of: a diffraction pattern, a transmission profile of the objective lens and a lens heating profile.

36. A method according to any of clauses 33 to 35, wherein the tuning step is performed in real time on production substrates using said wavefront data relating to exposure of said production substrates.

37. A method according to any of clauses 33 to 36, wherein the second model is a machine learning model.

38. A method according to clause 37, wherein the second model is a neural network.

39. A method according to any of clauses 33 to 38, wherein the method comprises:

obtaining a matching model or algorithm; and wherein there is at least one further first model, each relating to a different lithographic apparatus, and at least one further second model for tuning its respective first model; and the tuning step comprises using the matching model or algorithm and said pattern specific wavefront contribution to perform a co-optimized tuning of each of said first models and/or their corresponding second models, for said particular patterning device, in terms of maximizing yield or a performance parameter related to yield for a substrate exposed using each of said lithographic apparatuses.

40. A method according to clause 39, wherein the matching model or algorithm comprises an evolutionary algorithm or genetic algorithm.

41. A method according to any of clauses 32 to 38, wherein the method comprises: obtaining a matching model or algorithm; wherein there is at least one further first model, each relating to a different lithographic apparatus; and the tuning step comprises using the matching model or algorithm and said pattern specific wavefront contribution to perform a co-optimized tuning of each of said first models for said particular patterning device.

42. A method according to clause 41, wherein said co-optimized tuning is performed in terms of maximizing yield or a performance parameter related to yield for a substrate exposed using each of said lithographic apparatuses.

43. A method according to any of clauses 32 to 42, comprising obtaining a layer matching model or algorithm;

wherein there is at least two pattering devices which are to be exposed on the same apparatus to expose different layers of the same device on common substrates; and the tuning step comprises using the layer matching model or algorithm and said pattern specific wavefront contribution to perfom a co-optimized tuning of each of said first models for said patterning devices.

44. A method according to clause 41, 42 or 43, wherein said co-optimized tuning is performed in terms of maximizing yield or a performance parameter related to yield for said common substrates.

45. A method according to any of clauses 41 to 44, wherein the matching model or algorithm and/or layer matching model or algorithm comprises an evolutionary algorithm or genetic algorithm.

46. A method according to any of clauses 32 to 45, comprising determining a correction for the lithographic process using the first model and wavefront data.

47. A method according to clause 46, wherein said correction comprises a feed forward correction.

48. A method according to clause 46 or 47, comprising using said correction to correct the lithographic process.

49. A method according to any of clauses 32 to 48, wherein the first model is further augmented by a third model having been trained to tune the first model from a generic model for a type of said component to a specific model for the specific component.

50. A method according to clause 49, wherein the third model is a machine learning model.

51. A method according to clause 50, wherein the third model is a neural network.

52. A method according to clause 49, 50 or 51, comprising an initial step of training the third model for the specific component based on training data relating to the specific component.
53. A method according to any of clauses 32 to 52, wherein said first model is a physics based model.
54. A method according to any of clauses 32 to 53, wherein the first model is one of:
a lens heating model, said component being a lens system or lens thereof,
a patterning device heating model, said component being a patterning device; or
a substrate heating model, said component being a substrate.
55. A method according to any of clauses 32 to 54, wherein the tuning step comprises determining a process-specific initial lens correction for the first model, which tunes the first model to an initial state specific for said patterning device.
56. A method according to clause 55, wherein said determining a process-specific initial lens correction comprises performing an optimization on said wavefront data using said pattern specific wavefront contribution so as to optimize the wavefront to a target wavefront.
57. A method according to clause 56, wherein the optimization step is performed using an evolutionary algorithm, genetic algorithm or a second model, said second model comprising a machine learning model.
58. A method according to clause 56 or 57, wherein the optimization step further uses per field alignment data and/or levelling data to determine optimal lens settings per field.
59. A method according to clause 56, 57 or 58 wherein said wavefront data comprises wavefront data relating to exposures performed using a warmed lens at a plurality of different focus levels; and the optimization step further comprises determining a best focus value for an exposure using said patterning device.
60. A method according to any of clauses 55 to 59, wherein the method comprises determining a characteristic of the patterning device from said pattern specific wavefront contribution, and using said characteristic of the patterning device in the step of determining the product-specific initial lens correction.
61. A method according to any of clauses 55 to 60, wherein said determining a process-specific initial lens correction is performed in an initial setup phase and the method further comprises, during exposure using said patterning device on production substrates:
monitoring wavefront data relating to the production substrates to monitor whether the wavefront data has drifted from the optimized state reached using the process-specific initial lens correction;
and determining a correction if deemed necessary based on the monitoring step.
62. A method according to any of clauses 26 to 54, wherein said wavefront data comprises wavefront data relating to exposures performed using a warmed lens at a plurality of different focus levels; and the tuning step comprises determining a best focus value for an exposure using said patterning device.
63. A method according to clause 62, wherein said determining a best focus value comprises performing an optimization on said wavefront data using said pattern specific wavefront contribution so as to optimize for the wavefront with respect to focus.
64. A method according to clause 63, wherein the optimization step is performed using an evolutionary algorithm, genetic algorithm or a machine learning model.
65. A method according to clause 62, 63 or 64 wherein said tuning is performed:
in a setup phase and/or in real time during exposure using said patterning device on production substrates from wavefront data relating to the production substrates.
66. A method according to any of clauses 62 to 65, comprising, during production, monitoring whether said best focus is drifting by making three or more wavefront sensor measurements after an exposure of a substate, one said measurement at a present best focus value, one said measurement at said present best focus with a focus shift in a first direction, and one said measurement at said present best focus with a focus shift in a second direction;
comparing these three measurements can to determine if best focus has drifted; and
if it has drifted, adjusting the best focus value to an updated present best focus value.
67. An apparatus operable to perform the method of any of clauses 26 to 66, comprising:
a wavefront sensor operable to measure said wavefront data and a processor apparatus operable to perform the other steps of the method.
68. A lithographic apparatus comprising the apparatus of clause 67.
69. A lithographic apparatus according to clause 68, comprising:
an illumination system for providing the measurement illumination;
said projection optics; a patterning device support for supporting a patterning device; and
a substrate support for supporting a substrate.
70. A computer program comprising instructions to perform the method according to any of clauses 26 to 66.
71. A processor apparatus operable to execute the computer program according to clause 70.
72. A processor apparatus operable to tune a lithographic process for a particular patterning device, the apparatus configured to: obtain wavefront data relating to an objective lens of a lithographic apparatus, measured subsequent to an exposure of a pattern on a substrate using said patterning device; determine a pattern specific wavefront contribution from the wavefront data and a wavefront reference, the pattern specific wavefront contribution relating to said patterning device; and tune said lithographic process for said patterning device using said pattern specific wavefront contribution.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method of tuning a lithographic process for a particular patterning device, the method comprising:
   obtaining wavefront data relating to an objective lens of a lithographic apparatus, the wavefront data measured subsequent to an exposure of a pattern on a substrate using the particular patterning device;
   determining a pattern specific wavefront contribution from the wavefront data and a wavefront reference, the pattern specific wavefront contribution relating to the particular patterning device; and
   tuning the lithographic process for the particular patterning device using the pattern specific wavefront contribution.

2. The method as claimed in claim 1, wherein the tuning is based on wavefront data comprising a scalar representation as a map of wavefront error across a pupil plane of the objective lens.

3. The method as claimed in claim 1, wherein at least some of the wavefront data is related to a target wavefront.

4. The method as claimed in claim 3, wherein the target wavefront relates to a difference between a wavefront before and after exposure of a substrate.

5. The method as claimed in claim 1, wherein the pattern specific wavefront contribution comprises a difference between a first measured wavefront measured after the exposure and the wavefront reference.

6. The method as claimed in claim 5, wherein the wavefront reference comprises a second measured wavefront, the second measured wavefront having been measured prior to the exposure.

7. The method as claimed in claim 1, wherein the tuning comprises tuning a first model relating to a component of the lithographic apparatus using the wavefront data such that the first model is tuned for the particular patterning device.

8. The method as claimed in claim 7, wherein using the wavefront data comprises using the wavefront data in training a second model and using the trained second model to tune the first model.

9. The method as claimed in claim 8, further comprising:
   using the pattern specific wavefront contribution to calculate a characteristic of the particular patterning device used in the lithographic process; and
   using the characteristic of the particular patterning device in the tuning the first model with the second model.

10. The method as claimed in claim 9, wherein the characteristic of the particular patterning device comprises one or more selected from: a diffraction pattern, a transmission profile of the objective lens and/or a lens heating profile.

11. The method as claimed in claim 7, wherein the tuning is performed in real time on production substrates using the wavefront data relating to exposure of the production substrates.

12. The method as claimed in claim 8, wherein the second model is a neural network.

13. The method as claimed in claim 8, further comprising obtaining a matching model or algorithm,
   wherein there is at least one further first model, each relating to a different lithographic apparatus, and at least one further second model for tuning its respective further first model, and
   wherein the tuning comprises using the matching model or algorithm and the pattern specific wavefront contribution to perform a co-optimized tuning of each of the first models and/or their corresponding second models, for the particular patterning device, in terms of maximizing yield or a performance parameter related to yield for a substrate exposed using each of the lithographic apparatuses.

14. The method as claimed in claim 7, further comprising obtaining a matching model or algorithm,
   wherein there is at least one further first model relating to a different lithographic apparatus, and
   wherein the tuning comprises using the matching model or algorithm and the pattern specific wavefront contribution to perform a co-optimized tuning of the first model and further first model for the particular patterning device.

15. A non-transitory computer-readable medium having a computer program comprising instructions therein, the instructions, when executed by a computer system, configured to cause the computer system to at least:
   obtain wavefront data relating to an objective lens of a lithographic apparatus, the wavefront data measured subsequent to an exposure of a pattern on a substrate using a particular patterning device;
   determine a pattern specific wavefront contribution from the wavefront data and a wavefront reference, the pattern specific wavefront contribution relating to the particular patterning device; and
   tune a lithographic process for the particular patterning device using the pattern specific wavefront contribution.

16. A method of determining a correction for a lithographic process performed on a lithographic apparatus, the method comprising:
   obtaining a heating model which models the effect of heating on a component during the lithographic process;
   obtaining measured wavefront data relating to an objective lens of the lithographic apparatus, the wavefront data measured during the lithographic process; and
   determining a correction for the lithographic process using the heating model and measured wavefront data, to correct for the heating.

17. The method according to claim 16, further comprising calculating a characteristic of the patterning device used in the lithographic process, wherein the model uses the calculated characteristic to determine the correction.

18. The method according to claim 17, wherein the characteristic of the patterning device comprises one or more selected from: a diffraction pattern, a transmission profile of the objective lens and/or a lens heating profile.

19. The method according to claim 16, wherein the measured wavefront data relates to a difference in wavefront after and before an exposure step.

20. The method according to claim 16, wherein the model is a first model and the determining a correction comprises:
    obtaining a second model; and
    using the measured wavefront data and/or a characteristic of the patterning device to train the second model to tune the first model for the lithographic process.

21. A non-transitory computer-readable medium having a computer program comprising instructions therein, the instructions, when executed by a computer system, configured to cause the computer system to at least:
    obtain a heating model which models the effect of heating on a component during a lithographic process performed on a lithographic apparatus;
    obtain measured wavefront data relating to an objective lens of the lithographic apparatus, the wavefront data measured during the lithographic process; and
    determine a correction for the lithographic process using the heating model and measured wavefront data, to correct for the heating.

* * * * *